(12) United States Patent
Heringa et al.

(10) Patent No.: US 7,759,650 B2
(45) Date of Patent: Jul. 20, 2010

(54) IMPLEMENTATION OF AVALANCHE PHOTO DIODES IN (BI)CMOS PROCESSES

(75) Inventors: Anco Heringa, Waalre (NL); Thomas Frach, Aachen (DE); Prabhat Agarwal, Brussels (BE)

(73) Assignee: Koninklijke Philips Electronics N.V., Eindhoven (NL)

( * ) Notice: Subject to any disclaimer, the term of this patent is extended or adjusted under 35 U.S.C. 154(b) by 132 days.

(21) Appl. No.: 12/298,206

(22) PCT Filed: Apr. 10, 2007

(86) PCT No.: PCT/US2007/066316

§ 371 (c)(1),
(2), (4) Date: Oct. 23, 2008

(87) PCT Pub. No.: WO2007/127607

PCT Pub. Date: Nov. 8, 2007

(65) Prior Publication Data

US 2009/0065704 A1    Mar. 12, 2009

Related U.S. Application Data

(60) Provisional application No. 60/745,549, filed on Apr. 25, 2006.

(51) Int. Cl.
*G01T 1/24* (2006.01)
(52) U.S. Cl. .................................. 250/370.11
(58) Field of Classification Search .............. 250/370.01–370.15; 378/98.8; 257/E21.545, 257/E21.546, E21.585; 438/91, 237
See application file for complete search history.

(56) References Cited

U.S. PATENT DOCUMENTS 6,040,617 A * 3/2000 Patel ........................... 257/571
6,118,167 A * 9/2000 DiSimone et al. ........... 257/510

(Continued)

FOREIGN PATENT DOCUMENTS

DE        3829922 A1     3/1989

(Continued)

OTHER PUBLICATIONS

Li et al., "Fabrication and Characterization of 4H-SiC P-N. Junction Diodes by Selective-Epitaxial Growth Using TaC as the Mask," 2005, Journal of Electronic Materials, vol. 34, No. 4, pp. 450-456.*

(Continued)

*Primary Examiner*—David P Porta
*Assistant Examiner*—Kiho Kim

(57) ABSTRACT

A radiation detector (46) includes a semiconductor layer(s) (12) formed on a substrate (14) and a scintillator (30) formed on the semiconductor layer(s) (12). The semiconductor layer(s) (12) includes an n-doped region (16) disposed adjacent to the substrate (14), and a p-doped region (18) disposed adjacent to the n-doped region (16). A trench (20) is formed within the semiconductor layer(s) (12) and around the p-doped region (18) and is filled with a material (22) that reduces pn junction curvature at the edges of the pn junction, which reduces breakdown at the edges. The scintillator (30) is disposed over and optically coupled to the p-doped regions (18). The radiation detector (46) further includes at least one conductive electrode (24) that electrically contacts the n-doped region.

41 Claims, 5 Drawing Sheets

U.S. PATENT DOCUMENTS

| | | |
|---|---|---|
| 6,184,565 B1 * | 2/2001 | Beasom .................. 257/487 |
| 6,392,282 B1 | 5/2002 | Sahara et al. |
| 6,445,037 B1 * | 9/2002 | Hshieh et al. ............ 257/330 |
| 6,762,473 B1 | 7/2004 | Goushcha et al. |
| 6,858,912 B2 | 2/2005 | Marshall et al. |
| 2004/0178463 A1 | 9/2004 | Merrill et al. |
| 2005/0040445 A1 | 2/2005 | Mouli |
| 2006/0071235 A1 * | 4/2006 | Dehlinger et al. ......... 257/109 |
| 2008/0203309 A1 * | 8/2008 | Frach et al. ............... 250/362 |

FOREIGN PATENT DOCUMENTS

| | | |
|---|---|---|
| WO | 0233755 A2 | 4/2002 |
| WO | 2004027879 A2 | 4/2004 |
| WO | 2004102670 A2 | 11/2004 |

OTHER PUBLICATIONS

Kapusta M., et al., "Evaluation of LAAPS Arrays for High-Resolution Scintillator Matrices Readout," IEEE Transactions on Nuclear Science, Aug. 2002, 48(4), pp. 2002-2008.

* cited by examiner

IMPLEMENTATION OF AVALANCHE PHOTO DIODES IN (BI)CMOS PROCESSES

CROSS REFERENCE TO RELATED APPLICATIONS

This application claims the benefit of U.S. provisional application Ser. No. 60/745,549 filed Apr. 25, 2006, which is incorporated herein by reference.

The present invention relates to the medical imaging arts. It finds particular application to photodiodes (e.g., avalanche photodiodes) used in medical imaging systems and/or other applications.

In Positron Emission Tomography (PET), two coincident 511 keV gamma photons are detected by means of scintillation crystals. The scintillation crystal detects the gamma photons convert part of their energy to optical photons with energies in the blue pail of the electromagnetic spectrum. These optical photons are subsequently detected by one or more photodetectors, typically photomultipliers. The number of detected photons indicates the actual energy of the gamma, which can be lower than 511 keV because of scatter in the patient body. The time of the gamma hit is defined by the rising edge of the photodetector signal. Typically, timing resolution in nanosecond range is sufficient for the coincidence logic to detect coincident hits, i.e. hits occurring in a time window about 5-8 ns wide. However, higher timing resolution of well below a nanosecond will enable the localization of the particular decay along the line of response defined by the two gamma hits. This additional information can be used to significantly increase the signal-to-noise ratio of the acquired image.

Conventionally, photomultipliers are able to deliver timing resolution sufficient to implement time-of-flight PET (TOF-PET). Photomultipliers, being vacuum devices, have several drawbacks: they are bulky, require high voltage, and do not work well in high magnetic fields. Photodiodes have a significant advantage over photomultiplier tubes in the detectors for PET and/or other diagnostic scanners; however, photodiodes have a disadvantage in that their response is neither linear nor homogeneous across their entire face. Recently, a new class of photodetectors, the silicon photomultiplier, has emerged as a viable replacement to conventional photodetectors. Silicon photomultiplier properties are similar to their vacuum counterparts; however, they do not have the above-mentioned disadvantages. In addition, readout electronics can be integrated along the sensors. Assuming mass production, standard CMOS or BiCMOS silicon photomultipliers could potentially lead to cheaper photodetectors with the same or even better performance achieved by integrating digital readout electronics and significantly reducing the parasitics on the diode node. However, in a standard CMOS or BiCMOS process, the amount of freedom of adaptation of the process is limited for the purposes of making a more ideal photodiode. For example, it is not straightforward to avoid the pn junction edge breakdown effect like discrete diodes.

The basic building block of the silicon photomultiplier is an avalanche photodiode (APD) driven in a Geiger mode. In this mode of operation, the APD is biased several volts over the breakdown voltage. Driven in such mode, the diode junction is sensitive to single photons. The electron-hole pair generated in the junction by the absorbed optical photon will lead to a steep increase of the diode current due to avalanche multiplication of carriers in the junction. The current is either passively or actively quenched to allow the diode to recover and prepare for the detection of another photon. Assuming good substrate material properties and modern processing technology, the APD can stay in this unstable region for relatively long time, up to several milliseconds, until either thermally generated carriers or tunneling carriers force it to break down and initiate a dark count. Therefore, the breakdown behavior of the diode junction is of paramount importance. The breakdown is determined by the avalanche multiplication of carriers in the junction, which is dependent on the (semi-) local electric field strength.

Due to the higher curvature of the pn junction, the electric field exhibits a maximum at the diode edge, leading to premature breakdown at the perimeter of the diode. FIG. 7 illustrates such curved pn junction of an exemplary prior art APD. In order to make the APD sensitive over a large area, the device should be constructed in such a way that the depletion layer is equally sensitive over this area. For this purpose, one has to avoid edge effects. A number of techniques have been proposed to lower the field strength at the perimeter of the diode, leading to substantial decrease in the sensitive area of the diode. FIG. 8 illustrates a technique often used to avoid breakdown at the edges in which extra (in this case p-type) diffusions are added, which make the breakdown voltage higher at the edges. FIG. 9 illustrates another technique for avoiding edge breakdown in which a secondary implantation is included below the sensitive area to locally increase the field strength in the breakdown region. The resulting doping gradient at the edge of the structure increases the breakdown voltage and reduces the probability of edge breakdown.

These and other techniques conventionally used to suppress edge breakdown do so at the expense of reducing the sensitive area of the diode. Furthermore, while all required processing steps are commonly available in a standard CMOS or BiCMOS process, their application to create the required guard-ring structure is often prohibited by design rules, and many such diode designs have to use tricks to implement the guard-ring in a given unmodified CMOS or BiCMOS process.

The present application provides a new and improved photodiode and method of fabricating the photodiode that overcomes the above-referenced problems and others.

In accordance with one aspect, a radiation detector is illustrated. The radiation detector includes a semiconductor layer(s) formed on a substrate. The semiconductor layer(s) includes an n-doped region disposed adjacent to the substrate, and a p-doped region disposed adjacent to the n-doped region. A trench is formed within the semiconductor layer(s) and around the p-doped region and is filled with a material that reduces pn junction curvature at the edges of the pn junction, which reduces breakdown at the edges. A scintillator (30) is disposed over and optically coupled to the p-doped regions (18). The radiation detector further includes at least one conductive electrode that electrically contacts the n-doped region.

One advantage is photon detection with more uniform response across its face.

Another advantage lies in increased photodetector detection efficiency.

Another advantage resides in reduced photodetector or photodetector array package size.

Still further advantages of the present invention will be appreciated to those of ordinary skill in the art upon reading and understand the following detailed description.

The invention may take form in various components and arrangements of components, and in various steps and arrangements of steps. The drawings are only for purposes of illustrating the preferred embodiments and are not to be construed as limiting the invention.

Figure 2:
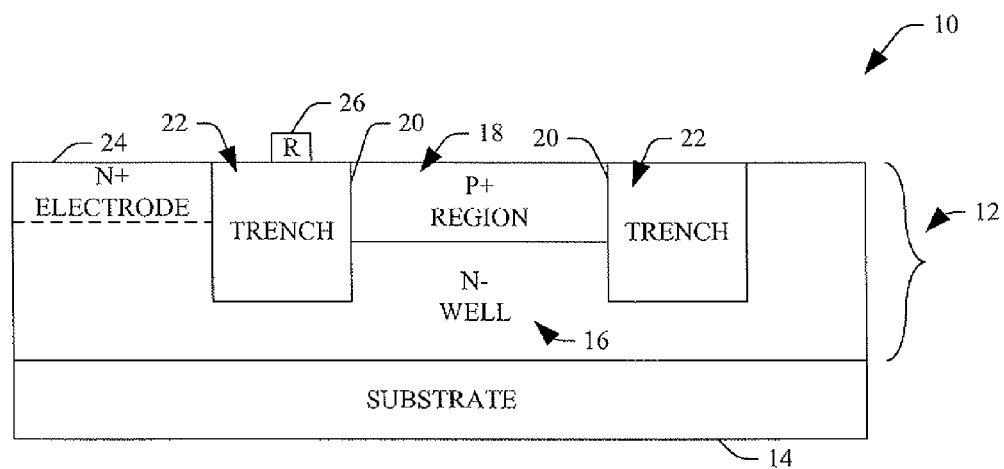
FIG. 2 is a side sectional view of a photodiode fabricated using shallow trench isolation technology to reduce pn junction edge breakdown exhibited with conventional photodiodes.
Figure 3:
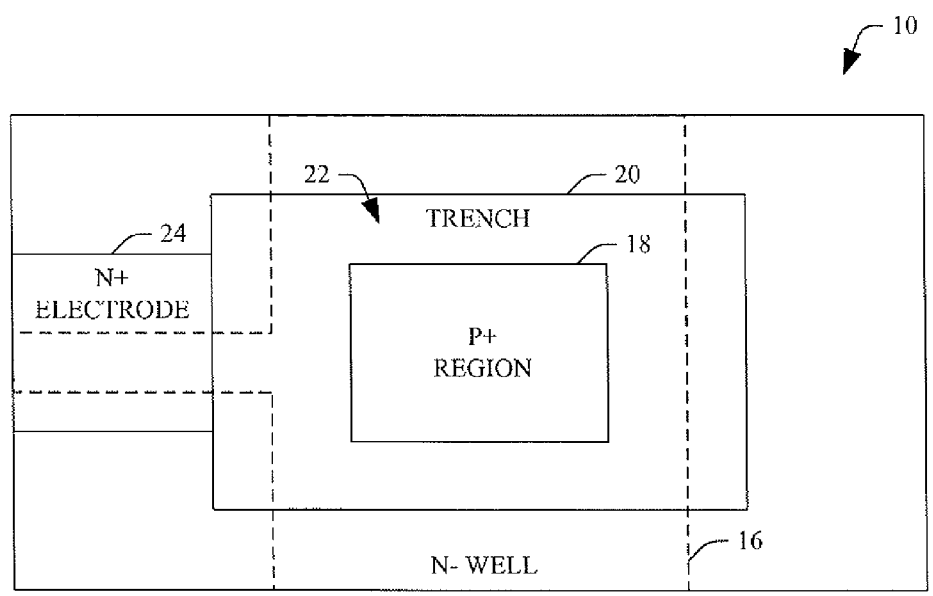
FIG. 3 is a top-down view of the photodiode illustrated in FIG. 2.

With reference to FIGS. 2 and 3, a photodiode 10 fabricated to suppress, reduce, eliminate, etc. premature edge breakdown associated with conventional photodiodes (e.g., avalanche photodiodes (APDs)) driven in Geiger or other modes is illustrated. FIG. 2 depicts a side sectional view of the photodiode 10, and FIG. 3 depicts a top-down view of the photodiode 10.

The photodiode 10 includes a semiconductors layer(s) 12 (e.g., silicon (Si), germanium (Ge), gallium arsenide (GaAs), etc.) formed (e.g., via photolithography, lithography, etc.) on a substrate 14 (e.g., a silicon, glass, sapphire, etc. wafer). The semiconductors layer(s) 12 includes an n-type (n− doped) well 16 disposed adjacent to a p-type (p+ doped) region 18 that form a pn junction therebetween. Such regions are formed via known techniques such as ion implantation (in which ions are implanted, thereby changing the physical properties semiconductor layer(s) 12), diffusion, and/or the like.

Figure 7:
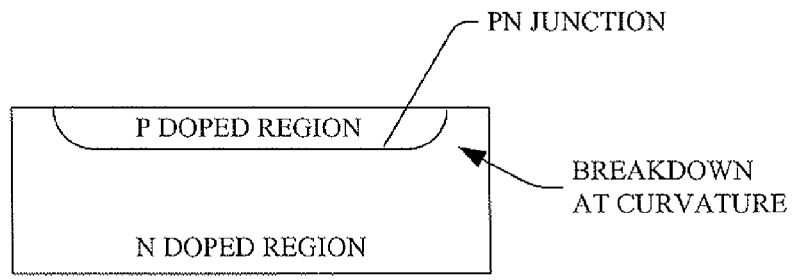
FIG. 7 is an illustration showing a curved pn junction of an exemplary prior art avalanche photodiode.
Figure 8:
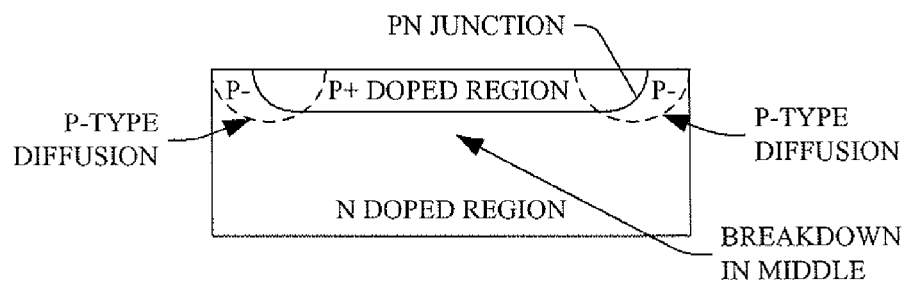
FIG. 8 is an illustration showing a technique used increase the breakdown voltage at the edges of a pn junction by adding extra diffusion material.
Figure 9:
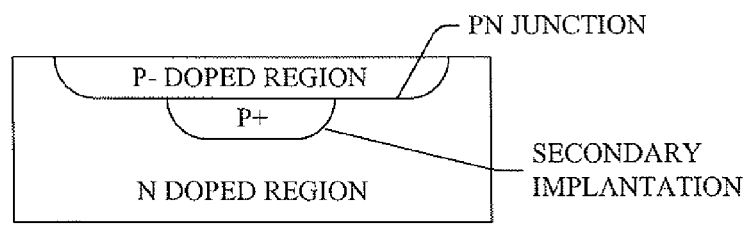
FIG. 9 is an illustration showing a technique used increase the field strength in the breakdown region through a secondary ion implantation proximate the sensitive area.

A trench 20 is formed within the semiconductors layer(s) 12 and surrounds the p-type region 18 and a portion of the n-type region 16. Various techniques such as etching are used to form the trench 20 in the semiconductor layer(s) 12. In one instance, shallow trench isolation (STI) technology or the like is used to form the trench 20 in the semiconductor layer(s) 12. The trench 20 is formed (e.g., shaped) to substantially reduce the curvature at the edge of the pn junction (such as the curvature illustrated in the photodiodes shown in FIGS. 7-9), which reduces breakdown at the edges of diffusions through edge termination of the junction. That is, the trench 20 is formed with substantially vertical sidewalls such that the p-region 18 abruptly ends, instead of curving, to mitigate breakdown at the pn junction.

The trench 20 is optionally oxidized and then subsequently filled with a material 22 such as a dielectric and/or a metal (e.g., to reduce crosstalk or cross contamination of light generated by neighboring photodiodes, etc.) via a deposition or other process. In instance in which ion implantation is used to create the n-type and p-type regions 16, 18, the trench 20 typically is formed and filled prior to the ion implantation process. Fringing fields at the pn Junction and absorption by the oxide within the trench 20 decrease the electric fields at the edges of the photodiode 10. The trench 20 also widens the depletion layer at the edges as a result of the fringing field at these edges. This widening effect can cure or remedy processing effects that occur at the trench edges where p-type dopants such as Boron or like are slightly sucked out and n-type dopants are slightly piled up.

The widening of the depletion layer can be enhanced by minor modifications in the standard CMOS or BiCMOS processing flow with respect to the trench 20 processing. For example, depletion layer widening can be enhanced or made stronger by using a dielectric material 22 that has a relatively high dielectric constant. Examples of suitable dielectrics 22 include, but are not limited to, a nitride (e.g., with a dielectric constant of about 7-8), an un-doped silicon (e.g., with a dielectric constant of about 12), $Al_2O_3$ (e.g., with a dielectric constant of about 8), $Ta_2O_5$ (e.g., with a dielectric constant of about 22), and/or $HfO_2$ (e.g., with a dielectric constant of about 25). The trench 20 can additionally or alternatively be filled with a conducting material that can block light emitted by a neighboring avalanche photodiode and, through proper biasing, facilitate avoiding premature breakdown at the trench edges.

The photodiode 10 also includes at least one conductive electrode (or n+ contact) 24 and an optional quenching resister 26 (at the p+ contact) that limits the amount of electrical current traveling through the photodiode 10, for example, to either actively or passively quench electrical current flow to allow the diode 10 to recover and prepare for the detection of another photon. The quenching resister 26 can be mounted to the photodiode via deposition, surface mount, solder, etc. technologies. In some instance, as discussed in detail below, the at least one electrode 24 is also used as the electrode for neighboring photodiodes, such as neighboring photodiodes within an array or matrix of photodiodes and/or a board with a plurality of such arrays or matrices.

The photodiode 10 and variations thereof can be fabricated in any unmodified modern CMOS or BiCMOS process using deep or shallow trench isolation technology. The resulting photodiode 10 offers excellent electrical isolation between the anode and the cathode, requires only a minimum sensitive area to be sacrificed, and reduces optical crosstalk between neighboring photodiode cells. In addition, the resulting photodiode 10 can be reduced in size, which enables denser and reduced packaging size. In this example, the semiconductors layer(s) 12 is depicted as a rectangular volume; however, other shapes such as circular, elliptical, hexagonal, triangular, irregular, etc. are also contemplated. The photodiode 10 can be used in applications such as medical imaging systems, secure communications using photon entanglement, high-energy physics and astronomy, LADAR, etc. With medical imaging applications, the photodiode 10 can be used to detect light (e.g., at low photon fluxes) with high timing resolution in Geiger or other modes. Such applications include time-of-flight positron emission tomography (TOF-PET), single photon emission computed tomography (SPECT), optical mammography, spectral CT and time-resolved spectroscopy.

Figure 4:
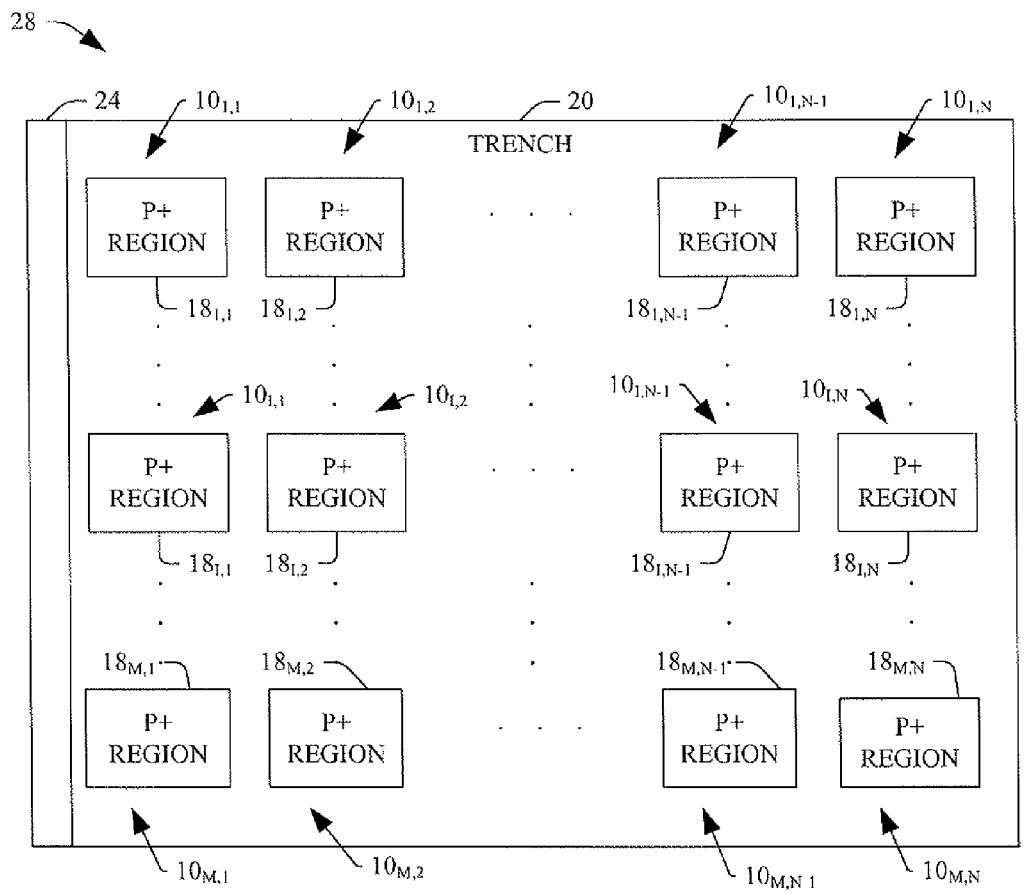
FIG. 4 is a top-down view of an arrangement of a plurality of the photodiodes illustrated in FIG. 2 mounted on a common substrate in an array or matrix configuration.

FIG. 4 illustrates a top-down view of a photodiode arrangement 28 in which M×N of the photodiodes 10, i.e., $10_{I,1}, \ldots, 10_{I,I}, \ldots, 10_{M,I}; 10_{I,2}, \ldots, 10_{I,2}, \ldots, 10_{M,2}; \ldots; 10_{I,N-1}, \ldots, 10_{I,N-1}, \ldots, 10_{M,N-1}; 10_{1,N}, \ldots, 10_{I,N}, \ldots, 10_{M,N}$ are mounted to a substrate (not visible), wherein M and N are integers equal or greater than one. As described above, each of the photodiodes 10 includes a pn junction formed at the interface between the n− well 16 (not visible) and the p+ region 18, i.e., $18_{I,1}, \ldots, 18_{I,1}, \ldots, 18_{M,1}; 18_{1,2}, \ldots 18_{I,2}, \ldots, 18_{M,2}; \ldots; 18_{I,N-1}, \ldots, 18_{I,N-1}, \ldots, 18_{M,N-1}; 18_{1,N}, \ldots, 18_{I,N}, \ldots, 18_{M,N}$. In addition, each of the photodiodes includes a suitably shaped trench 20, filled with a material 22, that surrounds each of the p+ regions 18 and the p+ contact 24. STI and/or other technology(s) are used to form each trench 20. In this example, the electrode 24 is shared by each of the M×N photodiodes 10 in the photodiode arrangement 28. However, in other instances, more than one electrode 24 can be formed within the photodiode arrangement 28, wherein one or more of the electrodes 24 are used by a single or multiple ones of the photodiodes 10, or each of the photodiodes 10 is associated with its own electrode 24.

Each of the photodiodes 10 in the photodiode arrangement 28 can be variously packaged in respect to its length, width, and/or depth. By way of non-limiting example, in one instance each of the photodiodes 10 is about 30 or 50 square microns or within a range from about 30 to 50 square microns. Assuming that each of the photodiodes 10 is about 50 square microns, about 400 or 20×20 of the photodiodes 10 can be formed on a 1×1 millimeter substrate. In one instance, the depth of the N doped region is about 300-400 nanometers and the depth of the p doped region is about 100 nanometers. In addition, the photodiodes 10 can be rectangular in shape, as illustrated herein, or square, circular, elliptical, etc. in shape.

Figure 5:
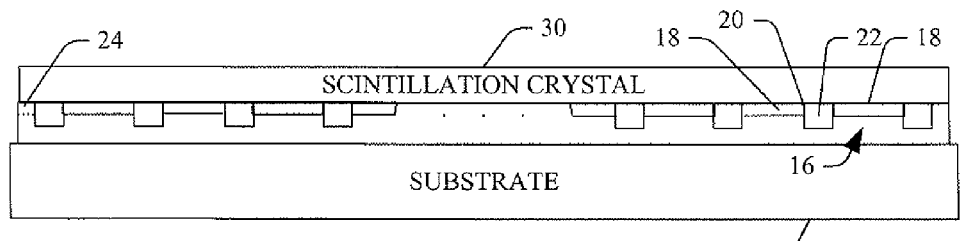
FIG. 5 is a side-view of the arrangement of photodiodes illustrated in FIG. 4 having a scintillator or scintillation crystal mounted thereto.

FIG. 5 illustrates a side view of the photodiode arrangement 28 in which a scintillator 30 is mounted (e.g., laminated) across at least one row (e.g., $10_{M,1}, 10_{M,2}, \ldots, 10_{M,N-1}, 10_{M,N}$) of the photodiodes 10 and optionally covers a 1×1 millimeter array to define one detector element. The scintillator 30 includes a material (e.g., a crystal) that absorbs high energy (ionizing) electromagnetic or charged particle radiation and, in response, fluoresces photons at a characteristic wavelength, releasing the previously absorbed energy. Examples of suitable scintillators include, but are not limited to, thallium doped sodium iodide crystals in gamma cameras used for nuclear medicine radioisotope imaging, bismuth germanate (BGO) coincidence detectors for detecting back-to-back gamma rays emitted upon positron annihilation in positron emission tomography machines, cerium-doped yttrium aluminum garnet (Ce:YAG) coating on the chip in some light-emitting diodes (LEDs), as well as LSO, YSO, LYSO, GSO, LGSO, etc. Each scintillator is optionally covered by a reflective layer to hold high photons in the crystal and to block crosstalk between adjacent crystals. The light photons subsequently are detected by the photodiodes 10 in which each of the photodiodes 10 detects a single photon. When light with sufficient photon energy strikes a photodiode 10, the photon is absorbed, resulting in generation of an electron and/or electron hole. If the absorption occurs in the junction's depletion region, these carriers are swept from the junction, producing an electrical signal (e.g., a photocurrent) that is proportional to the energy of the detected photon. With Avalanche photodiodes, each carrier may be multiplied by avalanche breakdown, resulting in internal gain within the photodiode, which increases the effective responsivity of the device.

Figure 6:
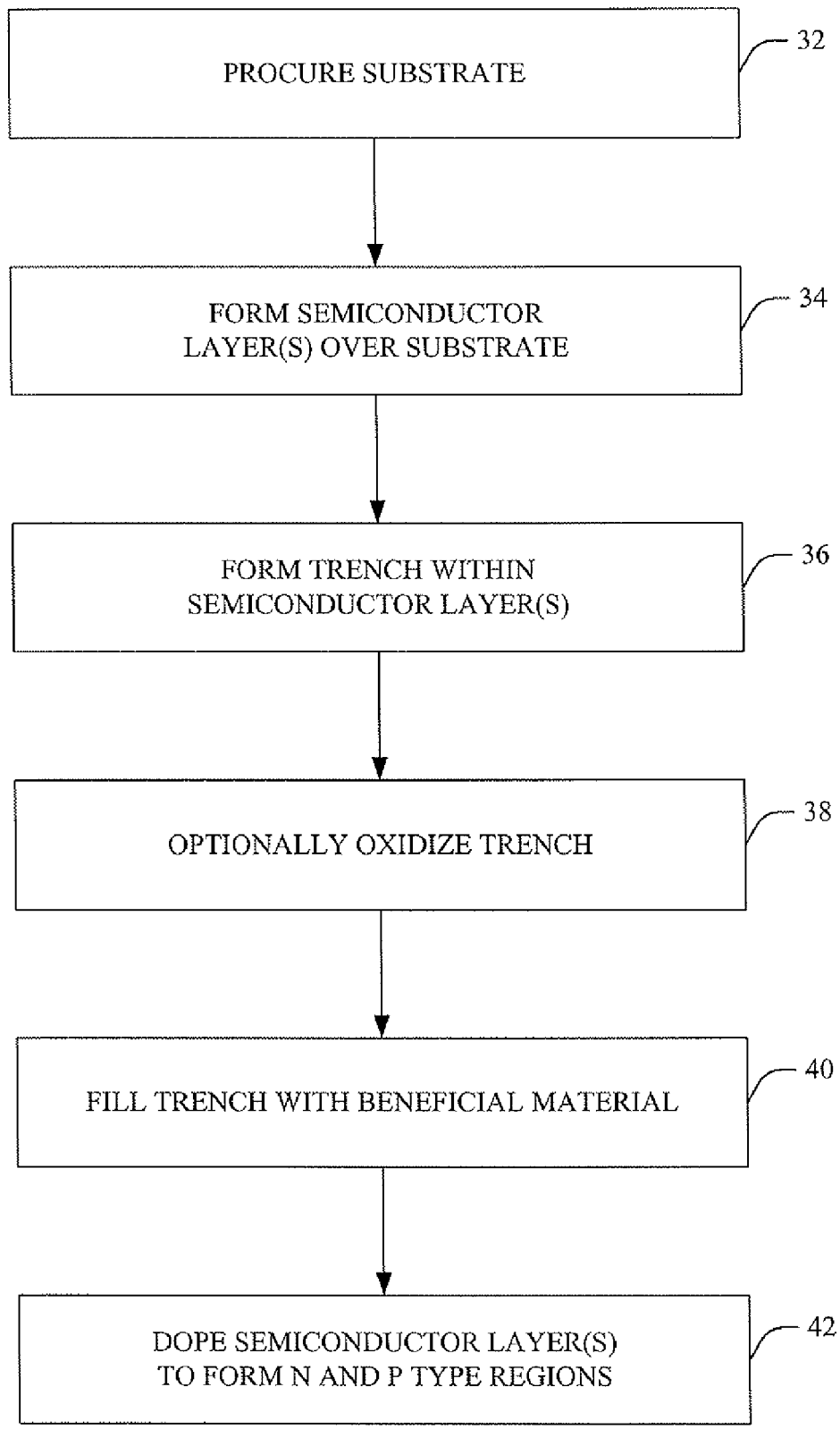
FIG. 6 is a method for fabricating the photodiode of FIG. 2.

FIG. 6 illustrates a method for fabricating the photodiode 10. In this example, a single photodiode 10 is formed; however, it is to be appreciated that the steps can be used to concurrently or serially form multiple photodiodes 10 to create the photodiode arrangement 28 shown in FIGS. 4 and 5, including an array or matrix of photodiodes, as described above. In addition, it is to be appreciated that the resulting photodiode 10 can be used in various applications such as medical imaging applications in which the scintillator 30 is laminated to the photodiodes 10, and a plurality of detector boards (e.g., a plurality of printed circuit boards, each including a plurality of the photodiode arrangements 28) are used within a medical imaging scanner (e.g., SPECT, PET, CT, etc.) to detect light transmitted through or emitted from within a subject.

At reference numeral 32, the substrate 14 is procured (e.g., purchased, fabricated, etc.). The substrate 14 is a semiconductor wafer formed from silicon and/or other semiconductor materials such as glass, sapphire, etc. At 34, the semiconductor layer(s) 12 is formed over the substrate 14. Various known process technologies, including deposition technologies such as physical vapor deposition (PVD), chemical vapor deposition (CVD), electrochemical deposition (ECD), molecular beam epitaxy (MBE), atomic layer deposition (ALD)), etc. can be used to form the semiconductor layer(s) 12 over the substrate 14. At 36, a removal process is used to form-n the trench 20. Such processes include deep or shallow trench isolation (STI) technology, etching (e.g., wet, dry, plasma, etc.), chemical-mechanical planarization (CMP), etc. The trench 20 is formed with substantially vertical side walls in order to prevent pn junction curvature and abruptly terminate the p-layer at the pn junction. At 38, the trench 20 is optionally oxidized. At 40, the trench 20 is filled with a material such as a dielectric (e.g., low k insulating materials) and/or metal. At 42, the properties of the semiconductor layer(s) 12 are modified. For example, the semiconductor layer(s) 12 is doped to create the p- and n-doped regions using techniques such as diffusion or ion implantation. The doping process is followed by furnace anneal, rapid thermal anneal (RTA), or other processes that activate the implanted dopants. Optionally, in a separate processing step, the scintillator 30 is mounted over the photodiode 10. In another embodiment, the doping step 42 is performed prior to the trenching step 36.

Figure 1:
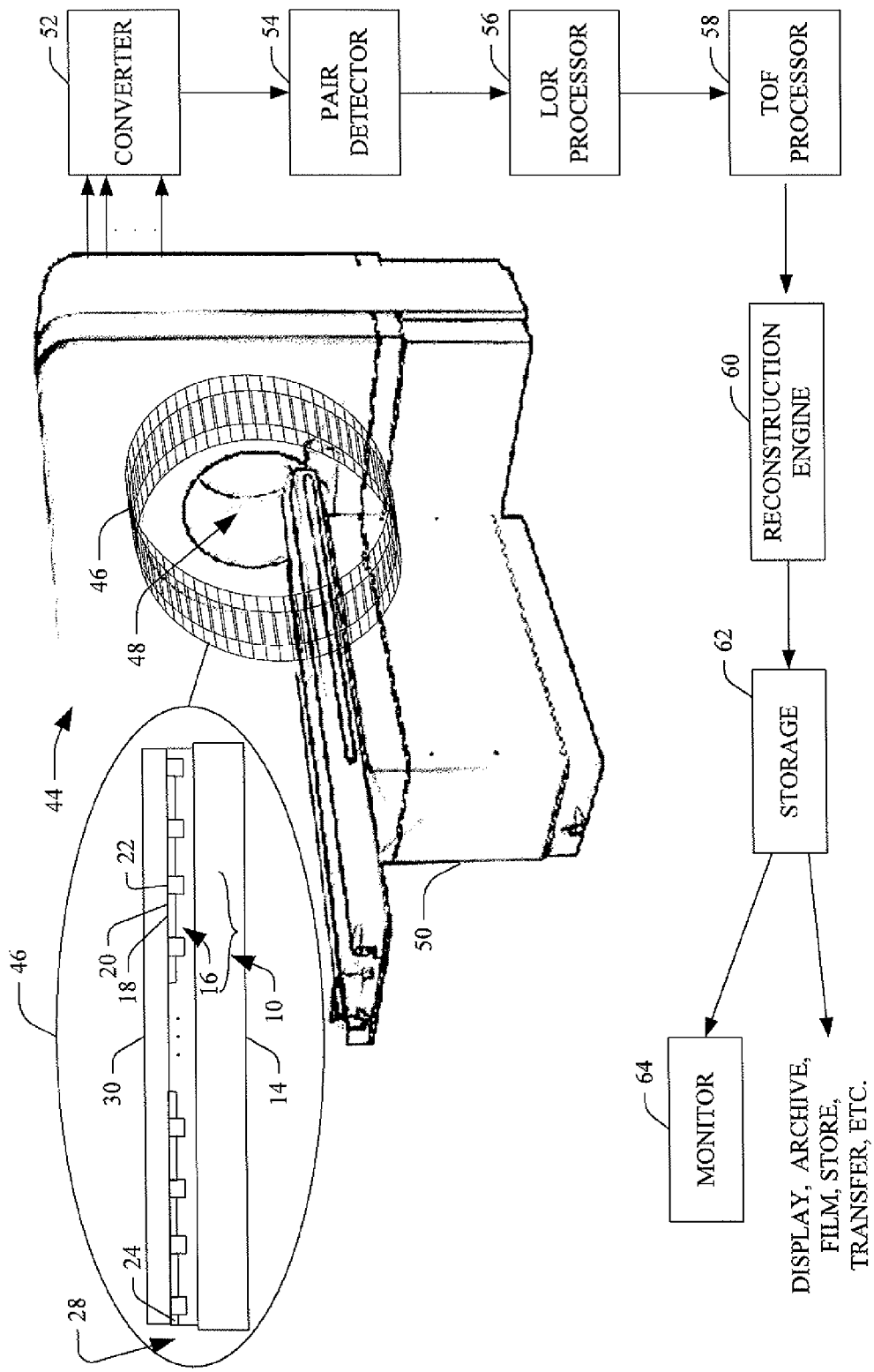
FIG. 1 is an exemplary medical imaging system.

With reference to FIG. 1, a medical imaging system 44 using a plurality of detectors 46, each detector including the photodiode arrangement 28/scintillator 30 assembly, to detect photons is illustrated. As depicted, each detector includes one scintillator 30, the n- well 16 and the array p+ regions 18 separated by the trench 20 filled with the material 22, and an associated one or more of the electrodes 24, which is shared by the neighboring photodiodes 10. In this non-limiting example, the medical imaging system 44 is a time-of-flight positron emission tomography (TOF-PET). However, it is to be appreciated that other medical imaging systems such as conventional PET, single photon emission computed tomography (SPECT), optical mammography, spectral CT, etc. are also contemplated herein.

The imaging system 44 includes a plurality of rings of the radiation detectors 46 (e.g., hundreds, thousands, etc.) arranged around an imaging region 48 to detect radiation events (e.g., gamma rays) emitted from within the imaging region 48. Each of the radiation detectors 46 includes a plurality of the photodiodes 10 adjacent to one or more of the scintillators 30 and configured in an array or matrix. As depicted, the plurality of radiation detectors 46 can be arranged in multiple rings (e.g., two, ten, a hundred, etc.) of detectors along an axial direction. The system 44 further includes a support mechanism 50 for positioning a patient or an imaging subject in the imaging region 48. In some instances, the support mechanism 50 is linearly movable in an axial direction generally transverse to the radiation detectors 46.

In preparation for imaging with the system 44, a suitable radiopharmaceutical is administered to the subject that will be scanned, and the subject is positioned within the imaging region 48. The radiopharmaceutical undergoes radioactive decay, which results in an emission of positrons. Each positron interacts with one or more nearby electrons and annihilates, which produces two oppositely directed (180 degrees) gamma rays having energies of about 511 keV each. The two oppositely directed gamma rays may strike opposing detectors at substantially the same time, i.e., coincidentally when positions originate equidistant from the pair of detectors. There is a slight time offset between coincident events due to the different travel distances.

Each of the scintillation crystals 30 produces a scintillation of light when struck by a radiation event such as a gamma ray produced from positron annihilation. The light produced by each crystal is received by one or more of the photodetectors 10 that are optically coupled to it. Each of the photodetectors 10 converts the light into a representative electrical signal. Each detector may also be associated with local and/or remote processing circuitry (not shown) that provides signal amplification, filtering, conditioning, etc. The conversion from gamma photon to light photons and light (photons) to electrical signal, as well as any other processing, can introduce different time delays into each of the resulting signals.

The electrical signals are conveyed to a converter 52, which digitizes and time stamps the signals. A pair detector 54 identifies pairs of substantially simultaneous or coincident gamma ray detections belonging to corresponding electron-positron annihilation events. This processing can include, for example, energy windowing (e.g., discarding radiation detection events outside of a selected energy window disposed about 511 keV) and coincidence-detecting circuitry (e.g., discarding radiation detection event pairs temporally separated from each other by greater than a selected time-window).

Upon identifying an event pair, a line of response (WOR) processor 56 processes the spatial information for each pair of events to identify a spatial LOR connecting the two gamma ray detections. Since the two gamma rays emitted by a positron-electron annihilation event are oppositely spatially directed, the electron-positron annihilation event is known to have occurred somewhere on the LOR. In TOF-PET, the radiation detectors 46 and the time stamping of the converter 52 have sufficiently high temporal resolution to detect a time-of-flight (TOF) difference between the two substantially simultaneous gamma ray detections. A TOF processor 58 analyzes the time difference between the times of each event of the coincident pair to localize the positron-electron annihilation event along the LOR.

The result, accumulated for a large number of positron-electron annihilation events, includes a set of histoprojections. The histoprojections are conveyed to a reconstruction engine 60 that reconstructs the histoprojections to generate one or more images using a suitable reconstruction algorithm such as filtered backprojection, iterative backprojection with correction, etc. The raw data and/or reconstructed images are stored in storage 62, and can be displayed, printed, archived, filmed, processed, transferred to another device, displayed on a monitor 64, etc. A radiologist or other suitable clinician can use the raw data and/or reconstructed image to control the TOF-PET system 44, diagnose the subject, etc.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

The invention claimed is:

1. A radiation detector, comprising:
   a substrate;
   a semiconductor layer(s) formed on the substrate in which the semiconductor layer(s) includes:
   at least one n-doped region disposed adjacent to the substrate, and
   a plurality of p-doped regions disposed adjacent to the n-doped region to define a plurality of pn junctions on the substrate;
   a trench formed within the semiconductor layer(s) and around each of the p-doped regions and filled with a material, the filled trench reduces curvature adjacent edges of the pn junctions and breakdown;
   at least one conductive electrode that electrically contacts the n-doped region; and
   a scintillator disposed over and optically coupled to the p-doped regions.

2. The radiation detector as set forth in claim 1, wherein the trench is formed using deep or shallow trench technology.

3. The radiation detector as set forth in claim 1, wherein the trench has substantially vertical sidewalls.

4. The radiation detector as set forth in claim 1, wherein the material reduces cross-contamination of light received by neighboring ones of the p-doped regions.

5. The radiation detector as set forth in claim 1, wherein the radiation detector is fabricated using one of a CMOS and BiCMOS process.

6. A medical imaging system employing a plurality of the radiation detectors according to claim 1 to detect photons within an imaging region of the medical imaging systems.

7. A diagnostic imaging system including a plurality of radiation detectors as set forth in claim 1.

8. A PET imaging system comprising:
   a plurality of rings of radiation detectors as set forth in claim 1;
   a converter which digitizes and time stamps outputs of the detectors;
   a coincidence which determines coincident pairs of detected radiation events from the time-stamped digital outputs; and
   a reconstruction system that reconstructs images from lines of response defined by determined coincident pairs.

9. A medical imaging system, comprising:
   a plurality of radiation detectors that generate analog signals indicative of detected radiation events, the plurality of radiation detectors each including a plurality of the semiconductor devices according to claim 1 in which each of the semiconductor devices detects a light event;
   scintillation crystals optically connected with the semiconductor devices to convert the detailed radiation events into the light events,
   a converter that digitizes the analog signals into digitized energy and time stamp signals;
   a coincidence detector that determines coincident pairs of detected radiation events; and
   a reconstructions system that reconstructs images from the coincident pairs of scattered radiation events.

10. A semiconductor device, comprising:
    a substrate;
    a semiconductor layer(s) formed on the substrate in which the semiconductor layer(s) includes:
    an n-doped region disposed adjacent to the substrate, and
    a p-doped region disposed adjacent to the n-doped region;
    a trench, formed within the semiconductor layer(s) and around the p-doped region and filled with a material, that reduces pn junction curvature at edges of the pn junction, which reduces breakdown at the edges; and
    at least one conductive electrode that electrically contacts the n-doped region.

11. The semiconductor device as set forth in claim 10, wherein the trench is formed using shallow trench technology.

12. The semiconductor device as set forth in claim 10, wherein the trench has substantially vertical sidewalls that abruptly terminates the p-type region at the pn junction.

13. The semiconductor device as set forth in claim 10, wherein the n and p doped regions are created through an ion implantation process.

14. The semiconductor device as set forth in claim 10, wherein the material is one of a dielectric and a metal.

15. The semiconductor device as set forth in claim 10, wherein the semiconductor device is an avalanche photodiode driven in Geiger mode.

16. The semiconductor device as set forth in claim 10, wherein the trench is oxidized prior to deposition of the material.

17. A PET imaging system comprising:
   a plurality of rings of radiation detectors as set forth in claim 16;
   a converter which digitizes and time stamps outputs of the detectors;
   a coincidence which determines coincident pairs of detected radiation events from the time-stamped digital outputs; and
   a reconstruction system that reconstructs images from lines of response defined by determined coincident pairs.

18. The semiconductor device as set forth in claim 10, wherein the semiconductor device is fabricated using one of a CMOS and BiCMOS process.

19. The semiconductor device as set forth in claim 10, further including:
   a quenching resistor disposed adjacent to the material within the trench, wherein the quenching resistor limits electrical current traveling through the photodiode.

20. A medical imaging system employing the semiconductor device according to claim 10 to detect photons within an imaging region of the medical imaging system.

21. The semiconductor device as set forth in claim 10, further including:
   a scintillator disposed over and optically coupled to the semiconductor layer(s).

22. The semiconductor device as set forth in claim 10 further including:
   a plurality of the p-doped regions disposed on the n-doped region, the trench extending around the p-doped regions.

23. A radiation detector comprising:
   the same conducting device as set forth in claim 22; and
   a scintillator disposed adjacent to and optically coupled to the p-doped regions.

24. A photodiode array including:
   a plurality of semiconductor devices as set forth in claim 10 on a common substrate.

25. A photodiode array, comprising:
   a substrate;
   a semiconductor layer(s) formed on the substrate in which the semiconductor layer(s) includes:
   at least one n-doped region disposed adjacent to the substrate, and
   a plurality of p-doped regions (disposed adjacent to the n-doped region to define a plurality of pn junctions on the substrate;
   a trench formed within the semiconductor layer(s) and around each of the p-doped regions and filled with a material, the filled trench reduces curvature adjacent edges of the pn junctions and breakdown; and
   at least one conductive electrode that electrically contacts the n-doped regions.

26. The photodiode array as set forth in claim 25, wherein the trench is formed using deep or shallow trench technology.

27. The photodiode array as set forth in claim 25, wherein the trench has substantially vertical sidewalls.

28. The photodiode array as set forth in claim 25, wherein the material reduces cross-contamination of light received by neighboring ones of the p-doped regions.

29. The photodiode array as set forth in claim 25, wherein the photodiode array is fabricated using one of a CMOS and BiCMOS process.

30. The photodiode array as set forth in claim 25, further including:
   at least one scintillator disposed over one and optically coupled to the p-doped regions.

31. A medical imaging system employing a plurality of the photodiode array according to claim 25 to detect photons within an imaging region of the medical imaging system.

32. A radiation detector comprising:
   a scintillator optically coupled to the photodiode array as set forth in claim 25.

33. A diagnostic imaging system including a plurality of radiation detectors as set forth in claim 32.

34. A method for fabricating a semiconductor device with decreased edge breakdown at a pn junction, comprising:
   forming a semiconductor layer(s) over a substrate;
   forming a trench within the semiconductor layer(s);
   filling the trench with a material; and
   doping the semiconductor layer(s) to form an p-doped region surrounded by the trench and a n-doped region below the p-doped region.

35. The method as set forth in claim 34, further including:
   forming at least one conductive electrode that electrically contacts the n-doped region.

36. The method as set forth in claim 34, further including:
   mounting a scintillator over a surface of the photodiode adjacent the p-doped region.

37. The method as set forth in claim 34, further including:
   forming a plurality of the p-doped regions in the semiconductor layer(s), each p-doped region being surround by a trench.

38. The method as set forth in claim 34, further including forming the trench using shallow trench isolation technology.

39. A semiconductor fabricated according to the process of claim 34.

40. A radiation detector fabricated according to the method of claim 34.

41. A diagnostic imaging system including a plurality of the radiation detectors as set forth in claim 40.

* * * * *